United States Patent
Ouzounov

(10) Patent No.: US 10,429,460 B2
(45) Date of Patent: Oct. 1, 2019

(54) RADIO FREQUENCY ANTENNA DEVICE FOR GENERATING A DIGITAL MAGNETIC RESONANCE INFORMATION SIGNAL

(71) Applicant: KONINKLIJKE PHILIPS N.V., Eindhoven (NL)

(72) Inventor: Sotir Filipov Ouzounov, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 514 days.

(21) Appl. No.: 14/782,872

(22) PCT Filed: Apr. 9, 2014

(86) PCT No.: PCT/EP2014/057128
§ 371 (c)(1),
(2) Date: Oct. 7, 2015

(87) PCT Pub. No.: WO2014/166983
PCT Pub. Date: Oct. 16, 2014

(65) Prior Publication Data
US 2016/0054405 A1    Feb. 25, 2016

(30) Foreign Application Priority Data
Apr. 9, 2013    (EP) .................... 13162902

(51) Int. Cl.
  *G01R 33/36*   (2006.01)
  *G01R 33/34*   (2006.01)
  *G01R 33/54*   (2006.01)
(52) U.S. Cl.
  CPC ......... *G01R 33/3621* (2013.01); *G01R 33/34* (2013.01); *G01R 33/54* (2013.01)

(58) Field of Classification Search
  CPC .... G01R 33/561; G01R 33/56; G01R 33/565; G01R 33/54; G01R 33/4833
  See application file for complete search history.

(56) References Cited

U.S. PATENT DOCUMENTS 6,148,048 A * 11/2000 Kerth ................... H04B 1/0007
                                                              341/139
7,242,337 B2   7/2007 Uemori et al.
(Continued)

FOREIGN PATENT DOCUMENTS

DE    102011006578 A1    10/2012
GB       2290875 A         1/1995
(Continued)

OTHER PUBLICATIONS

DelaRosa Sigma-Delta Modulators: Tutorial Overview, Design Guide and State of the Art Survey, IEEE Transactions on Circuits and Systems, vol. 58, No. 1 Jan. 2011 p. 1-21.
(Continued)

*Primary Examiner* — Jermele M Hollington
*Assistant Examiner* — Suresh K Rajaputra

(57) ABSTRACT

A radio frequency (RF) antenna device (140) provides magnetic resonance (MR) information from an examination space (116) of a MR imaging system (110). At least one RF coil (142) with at least one connection port (144) receives an analog MR information signal and at least one analog-to-digital converter (ADC) (150) converts the analog MR information signal into a digital MR information signal with a sampling frequency which is below the Nyquist frequency of an RF carrier signal. The at least one ADC (150) is a RF band-pass sub-sampled sigma-delta analog-to-digital converter. The RF coil and the components into the RF antenna device are integrated to provide the MR information signal as a digital signal. The digital MR information signal can
(Continued)

easily be further processed and transmitted, even in the presence of strong magnetic and RF fields.

17 Claims, 8 Drawing Sheets

(56) References Cited

U.S. PATENT DOCUMENTS

| | | | |
|---|---|---|---|
| 7,777,490 B2 | 8/2010 | Haans et al. | |
| 2002/0079892 A1* | 6/2002 | Baumgartl | G01R 33/3621 324/309 |
| 2008/0164879 A1* | 7/2008 | Bollenbeck | G01R 33/3621 324/322 |
| 2009/0230966 A1* | 9/2009 | Ehnholm | G01R 33/3415 324/322 |

FOREIGN PATENT DOCUMENTS

| | | |
|---|---|---|
| WO | 9307679 | 4/1993 |
| WO | 0008764 | 2/2000 |

OTHER PUBLICATIONS

Harvey, "Overview of the MRI System" Proc. Intl. Soc. Mag. Reson. Med. 20, May 5, 2012 p. 8281.

K. Philips, "A 4.4mW 76dB complex $\Sigma\Delta$ ADC for Bluetooth receivers", ISSCC 2003.

S. Jantzi et al "Bandpass sigma-delta analog-to-digital conversion", IEEE Trans. On Circuits and Systems, pp. 1406-1409, 1991.

J. van Engelen, "Stability analysis and design of bandpass sigma delta modulators", Philips sponsored Ph.D. thesis at TU/e, 1999.

* cited by examiner (State of the art)

(State of the art)

| AQUISITION | ANALOG PROCESSING | DIGITIZATION + DATA REDUCTION | DATA TRANSPORT | RECONSTRUCTION | |
|---|---|---|---|---|---|
| In-coil | Exam room | Tech room | Tech room | Tech room | *State of the art* |
| In-coil | In-coil (transport) | In-coil (grouped per 4/8 el.) | Exam + Tech room | Tech room | *First embodiment* |
| In-coil | None | In-coil (@ coil element) | Coil + Exam + Tech | Tech room | *Second embodiment* |

AQUISITION = coil element + signal and matching towards receiving chain

ANALOG PROCESSING = analog signal conditioning, scaling, filtering before the digitization unit DIGITIZATION + DATA REDUCTION = ADC + digital demodulator + sample rate reduction + digital encoding DATA TRANSPORT = "merging" various data streams and transport to a single higher bandwidth data stream towards the reconstructor RECONSTRUCTION = image generation by fourier transforming (and correcting) the acquired time domain signals

FIG. 8

RADIO FREQUENCY ANTENNA DEVICE FOR GENERATING A DIGITAL MAGNETIC RESONANCE INFORMATION SIGNAL

CROSS REFERENCE TO RELATED APPLICATIONS

This application is a U.S. national phase application of International Application No. PCT/EP2014/057128, filed on Apr. 9, 2013, which claims the benefit of EP Application Serial No. 13162902.4 filed on Apr. 9, 2013 and is incorporated herein by reference.

FIELD OF THE INVENTION

The invention relates to the field of magnetic resonance (MR) imaging. In particular, the invention relates to a radio frequency (RF) antenna device for providing magnetic resonance information from an examination space of a magnetic resonance (MR) imaging system, a MR imaging system employing at least one such RF antenna device, a method for providing magnetic resonance information from an examination space of a magnetic resonance (MR) imaging system, and a software package for upgrading a magnetic resonance (MR) imaging system.

BACKGROUND OF THE INVENTION

In magnetic resonance (MR) imaging systems, a main magnet is used to generate a strong static magnetic field, which is homogenous in a volume of interest. The volume of interest corresponds to an examination space of the MR imaging system and is typically a spherical or ellipsoid space with a diameter of about 50 centimeters.

Typically, two types of radio frequency (RF) coils are used for exciting nuclear spins within a subject of interest, usually a patient, and detecting signals from them. Birdcage coils and transverse electromagnetic (TEM) coils are widely used for MR imaging in the very-high RF band (VHF) and have been introduced in commercial 3 T MR imaging scanners. The RF coils can be used as transmit and receive coils, as transmit only coils, or as receive only coils.

The RF coils may comprise different coil elements, which have at least one feeding port each for providing single channel information. When used as receive coil, each connection port provides an analog RF signal, also referred to as analog MR information signal, which has to be processed within the MR imaging system. The analog MR information signal is processed and reconstructed to finally obtain an MR image, as described in detail below.

A partitioning of components used in state of the Art MR imaging systems for processing the MR information signal is shown in FIG. 1. The MR imaging system 1 comprises four functional blocks, which are an acquisition block 2, a digitization block 3, a processing block 4, and a reconstruction block 5. As can be seen in FIG. 1, these blocks 2, 3, 4, 5 are provided in different locations. The acquisition block 2 is provided close to the subject of interest, where the magnetic resonance signals are acquired. The digitization block 3 is located within an exam room and converts the analog MR information signal into a digital MR information signal. The exam room is usually build to surround the acquisition block 2, i.e. the exam room also contains required magnets and coils of the MR imaging system 1. Nevertheless, the digitization block 3 is located apart from the acquisition block 2 within the exam room. The acquisition block 2 and the digitization block 3 are typically connected by means of coaxial cables 6 to transmit the analog MR information signal. The processing block 4 and the reconstruction block 5 are located in a tech room, which is separate from the exam room. The digitization block 3 is connected by means of digital cables 7 to the processing block 4, which is also connected by means of digital cables 7 to the reconstruction block 5. The digital cables 7 are provided e.g. as optical cables.

FIG. 2 shows in detail the acquisition block 2 and the digitization block 3 with an intermediate multiplexing block 8. The acquisition block 2 in this state of the Art MR imaging system 1 is implemented as integral RF antenna device and comprises two RF coils 12, each having a connection port 14, at which the analog MR information signal is provided. It is to be noted that the analog MR information signal in this state of the Art MR imaging system 1 comprises two individual signals. The acquisition block 2 further comprises two low noise amplifiers 16 for amplifying the analog MR information signal from the two RF coils 12. The amplified MR information signal is propagated in an analog way via coaxial cables 6 to the intermediate multiplexing block 8. The multiplexing block 8 is located in the exam room close to the acquisition block 2 to facilitate and reduce cabling of the coaxial cables 6. The multiplexing block 8 performs analog multiplexing of the two individual signals of the amplified analog MR information signal, and provides an analog multiplex MR information signal. The analog multiplex MR information signal is transferred from the multiplexing block 8 via coaxial cable 6 to the digitization block 3. The digitization block 3 is located away from the acquisition block 2 within the exam room, as described above. The digitization block 3 comprises a receive amplifier 21, a discrete band-pass filter 22 and an analog to digital converter (ADC) 24, which is provided as a converter IC. The analog multiplex MR information signal is filtered with the band-pass filter 22 and converted directly at the RF frequency with the ADC 24, which is a wideband ADC. In state of the art implementations, a commercially available ADC is used. However, due to a relatively high carrier frequency of the RF signal, which is typically about 100 MHz, and a required ADC resolution, the ADC is used in sub-sampling mode, where the sampling frequency of the ADC 24 is lower than two times the Nyquist frequency of the MR information signal. In order to implement a sufficient dynamic range, two ADCs 24 are used in a parallel configuration for coarse and fine conversion. Such a MR imaging system 1 and RF antenna device are e.g. known from WO 2006/048816 A1.

This implementation leaves possibilities for further improvements. First, the propagation of the high frequency analog MR information signal to the electronic processing unit requires RF cables with an excellent shielding due to the strong magnetic and/or RF fields used in MR imaging systems, which complicates the cabling. Typically, cable trapping of common mode currents has to be used, which further increases the cost of the implementation and reduces the reliability of the whole system. Furthermore, a sharp analog band-pass filter is required, which requires a high effort in providing the filter. Also, the electronics, in particular the two broadband ADCs, has significant power consumption. In addition, there are high requirements for analog signal matching and equalization in order to assure a linear dynamic range of the signal processing. Still further, a large volume or area is occupied by the electronics of the different blocks due to their big form factor. The implementations of the blocks can only be provided with a relatively low level of integration.

With new and emerging applications of MR imaging (MRI), frequently an increased number of channels is required, which additionally increases the cost and complexity of the MR imaging system, in particular the complexity of the analog cabling and the electronics of the multiplexing block and the digitization block is increased.

SUMMARY OF THE INVENTION

It is an object of the invention to provide an improved (RF) antenna device for receiving magnetic resonance information from an examination space of a magnetic resonance (MR) imaging system, an improved MR imaging system employing at least one such RF antenna device, a method for providing magnetic resonance information from an examination space of a magnetic resonance (MR) imaging system, and a software package for upgrading a magnetic resonance (MR) imaging system, which provide an improved signal processing and overcome at least some of the above disadvantages.

In one aspect of the present invention, the object is achieved by a radio frequency (RF) antenna device for providing magnetic resonance (MR) information from an examination space of a MR imaging system, comprising at least one RF coil with at least one connection port for receiving an analog MR information signal, and at least one analog to digital converter (ADC), which is connected to the at least one connection port and which converts the analog MR information signal into a digital MR information signal, whereby the at least one ADC is a RF band-pass sub-sampled sigma-delta analog to digital converter.

The resulting RF antenna device provides an integration of the at least one RF coil and the components required to provide the MR information signal as a digital signal, i.e. the RF antenna device integrally comprises an acquisition block and a digitization block. The digital MR information signal can easily be further processed. Also, reliable transmission of the digital MR information signal can be easily realized, e.g. by using error detection and/or error correction means, even in the presence of strong magnetic and RF fields. Preferably, digital signal cables, further preferred fiber optical signal cables, are used for transmission of the digital MR information signal, which are easier to handle than analog coaxial cables for transmission of the analog MR information signal. Fiber optical signal cables overcome the problem of trapping of common mode currents. Inside the RF antenna device, the connection port and the ADC can be located close to each other thus requiring short analog connections, so that falsifications of the analog MR information signal are reduced. Mixing of the RF signal can be done in the digital domain and does not require I/Q correction. Preferably, the RF band-pass sub-sampled sigma-delta analog to digital converter has a fix programmable sampling frequency. A solution that uses only one frequency significantly reduces coupling and interference problems and simplifies the system implementation and the integration of the RF antenna device into the MR imaging system. When the sampling frequency is made programmable, the RF band-pass sub-sampled sigma-delta analog to digital converter can be used with the different frequencies at which the RF signal is transmitted and received.

Sigma-delta modulators have a relatively low cost, a high robustness, and power consumption and dynamic range can easily be exchanged. Preferably, the sigma-delta modulator comprises a negative feedback system that processes an error signal instead of the signal itself, which relaxes the requirements of most building blocks of the ADC. Therefore, high resolution and high linearity for low power can be achieved. Generally, a band-pass sigma-delta analog to digital conversion is efficient since it provides high resolution in the signal band of interest only. With the increased integration level of components in the RF antenna device, also the occupied area and/or space can be reduced. Further, such implementation enables larger channel count which otherwise would require too much space and too high complexity. All in all, the application of a band-pass sigma-delta ADC simplifies the complexity of the total receiver system as critical functional blocks like mixers and tuners are realized in digital domain, where they can more easily be realized. Accordingly, performance improvements can be achieved.

The RF coil can be any kind of coil suitable for receiving MR information. The RF coil is either a pure receive coil, or a transmit and receive coil. Nevertheless in the context of this document, only the receive function of the coils is relevant and discussed.

Subsampling means, that the at least one sigma-delta analog to digital converter has a sampling frequency which is below twice the Nyquist frequency of the highest frequency component within the analog MR information signal. This violates the requirements of the NyquistShannon sampling theorem, which requires sample rate which is at least two times the highest frequency component of the MR information signal. Nevertheless, since the modulation signal within the analog MR received signal is a relatively narrow-banded signal, which is aliased to an aliasing frequency below the sample frequency, preferably below half the sampling frequency, the modulation signal can reliably be digitized when subsampling is applied.

According to a preferred embodiment the RF band-pass sub-sampled sigma-delta analog to digital converter comprises a summator, a loop band-pass filter, a quantizer unit, and a digital to analog converter unit, whereby the quantizer unit receives an analog filter signal of an analog input signal filtered by the loop band-pass filter and converts it into a digital output signal, which is provided as the digital MR information signal by the RF antenna device, the digital to analog converter unit receives the digital output signal of the quantizer unit and converts it into an analog feedback signal, and the summator is provided at an input path of the loop band-pass filter to combine the analog MR information signal and the analog feedback signal to the input signal. This implementation of the sigma-delta analog to digital converter allows for efficient loop band-pass filtering and efficient analog to digital conversion. In case of a continuous-time sigma-delta analog to digital conversion, the loop band-pass filter also acts as an inherent anti-alias filter, which relaxes filter requirements of filters preceding the sigma-delta analog to digital converter or even eliminates the need for a preceding filter. The analog feedback signal is negative, so that the summator subtracts an absolute value of the analog feedback signal from the analog MR information signal.

According to a preferred embodiment the quantizer unit and the digital to analog converter unit are provided as N bit converter units with N being an integer≥1. This means that the integer N is bigger or equal to 1. The use of a multi-bit converters enables to achieve a high performance in terms of dynamic range and linearity.

According to a preferred embodiment the quantizer unit and the digital to analog converter unit are provided as 1-bit converter units. The use of 1-bit converter units simplifies the required signal processing and the hardware implementation. A 1-bit converter is very cost effective.

According to a preferred embodiment the loop band-pass filter is a tunable filter which is adjustable to a modulation frequency of the analog MR information signal. Therefore, the ADC can easily be adapted for the use in different kinds of MR measurements, where modulation signals with different center frequencies have to be processed. The filter is preferably tuned by modification of filter coefficients, which can easily be done. By tuning the filter, a center frequency of the band-pass filter can be modified. This enables the modification of the RF band-pass sub-sampled sigma-delta analog to digital converter to different RF carrier frequencies of the modulation signal. This solution is flexible and efficient as it integrates the filter tuning function in the RF band-pass sub-sampled sigma-delta analog to digital converter.

According to a preferred embodiment the at least one ADC is provided with a sampling frequency being less than two times the Nyquist frequency of a carrier signal of the analog MR information signal. Hence, the sampling frequency is less than twice of the highest frequency of the carrier signal. Using this sampling frequency, the carrier signal is sub-sampled inside the ADC. Due to the sub-sampling, in the digitized output of the ADC, the modulation signal is aliased at a low center frequency. In this way, analog to digital conversion and frequency down conversion happen simultaneously. The consecutive digital signal processing is done at a low sampling frequency, which is easy to implement. By choosing a sub-sampling factor $K_{ssF}$, the frequency location of the aliased modulation signal can be adapted. Hence, a choice of the possible subsample factor in relation to the required modes of operation of the complete MRI front-end, i.e. the data acquisition block, can be performed.

According to a preferred embodiment the at least one ADC is provided with a sampling frequency being at least two times higher than the Nyquist frequency of a modulation signal in the analog MR information signal. The sample frequency is therefore high enough to enable reliable sampling of the modulation signal according to its Nyquist frequency. Higher sampling frequencies can be chosen to enable a higher degree of oversampling. The lower the frequency of the modulation signal, the lower the sample frequency can be chosen. Accordingly, analog to digital conversion and further digital signal processing can be performed with low computational effort.

According to a preferred embodiment the at least one ADC is provided as a single integrated circuit. The implementation as a single chip provides a space advantages as it requires only small area and/or space for the ADC. This allows positioning the ADC close to the RF coil element. Furthermore, this implementation brings the benefit of reduced RF cabling. Accordingly, the overall requirements for the RF antenna device and the corresponding MR imaging system in respect to area and/or space are rather low. Preferably, signal processing of the ADC is optimized with a fixed choice of the sampling frequency being used in the design. Further preferred, the single chip is an Application Specific Integrated Circuit (ASIC). Still further preferred, the single integrated circuit comprises further elements for processing the MR information signal.

According to a preferred embodiment the single integrated circuit comprises a digital decimation filter. The digital decimation filter refers to a digital processing step of the MR information signal. In general, the decimation filter refers to a digital processing block. The further integration improves efficiency of the entire MR signal processing. In particular, it enables the provisioning of a highly integrated and efficient RF antenna device and requires only small area and/or space.

According to a preferred embodiment the RF antenna device comprises at least one analog input filter, which is provided between the at least one analog to digital converter and the at least one connection port. The input filter allows a signal processing of the analog MR information signal prior to its processing in the ADC. With the additional input filter, the loop filter requirements of the RF band-pass sub-sampled sigma-delta analog to digital converter can be reduced, so that stability of the loop band-pass filter and the complete sigma-delta ADC can be improved or more easily be achieved. Also the design of the loop band-pass filter can be facilitated. Preferably, the analog input filter is a band-pass filter.

According to a preferred embodiment the RF antenna device comprises at least one low noise amplifier, which is provided between the at least one analog to digital converter and the at least one connection port. The low noise amplifier (LNA) provides the analog MR information signal with an amplified amplitude for further processing and assures a proper impedance at the input.

In another aspect of the present invention, the object is achieved by a magnetic resonance (MR) imaging system, comprising a main magnet for generating a static magnetic field, a magnetic gradient coil system for generating gradient magnetic fields superimposed to the static magnetic field, an examination space provided to position a subject of interest within, at least one radio frequency (RF) antenna device as specified above for providing magnetic resonance information from the examination space, and a digital signal processing unit for processing of a digital MR information signal provided by the at least one RF antenna device.

Accordingly, the RF antenna device already provides the digital MR information signal, which can be easily transmitted to any suitable location, where the digital signal processing unit can be located. The digital signal processing unit may integrally comprise a processing block and a reconstruction block. The processing block may comprise a digital decimation filter, which refers to a digital processing step of the MR information signal when an oversampled ADC, e.g. a sigma-delta ADC, has been used for the digitization.

According to a preferred embodiment the MR imaging system comprises a control unit for controlling the at least one analog to digital converter (ADC) of the RF antenna device. The control unit is preferably a control unit for controlling the entire operation of the MR imaging device, so that no additional control unit has to be provided for the purpose of controlling the ADC. The control unit preferably sets operational parameters of the ADC including the sampling frequency, the band-pass frequency and other filter parameters. The control unit is preferably provided in a tech room of the MR imaging system.

In a further aspect of the present invention, the object is achieved by a method for providing magnetic resonance information from an examination space of a magnetic resonance (MR) imaging system, comprising the steps of providing a radio frequency (RF) antenna device with at least one RF coil having at least one connection port, receiving an analog MR information signal at the at least one connection port of the at least one RF coil within the RF antenna device, performing an analog to digital conversion of the analog MR information signal into a digital MR information signal in the RF antenna device, whereby the step of performing an analog to digital conversion comprises performing a bandpass sub-sampled sigma-delta analog to digital conversion, and transmitting the digital MR information signal from the RF antenna device via a communication link.

According to a preferred embodiment the method comprises the additional steps of receiving the digital MR information signal from the RF antenna device in a digital signal processing unit, which is provided apart from the RF antenna device, and processing the digital MR information signal in the digital signal processing unit. Hence, the MR information is transmitted from the RF antenna device to the digital signal processing unit in the digital domain, which can be realized with high robustness and low cost, in particular in the presence of magnetic and/or RF fields. The signal processing unit comprises a processing block and a reconstruction block, which can be provided separately or together. Preferably, the processing block and the reconstruction block are commonly provided in a tech room of the MR imaging system. Alternatively, the processing block and the reconstruction block are commonly provided in an examination room, where also the RF antenna device is located. The RF antenna device is further preferred positioned separate from the processing block and the reconstruction block. In an alternative embodiment, the processing block is located in the exam room and the reconstruction block is located in a tech room. The above processing block comprises a digital decimation filter, which refers to a digital processing step of the MR information signal encoded with band-pass sub-sampled SDM ADC.

In a still further aspect of the present invention, the object is achieved by a software package for upgrading a magnetic resonance (MR) imaging system, whereby the software package contains instructions for controlling the MR imaging system according to the above method. In particular, the instructions of the software package are executed in a control unit of the MR imaging system.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
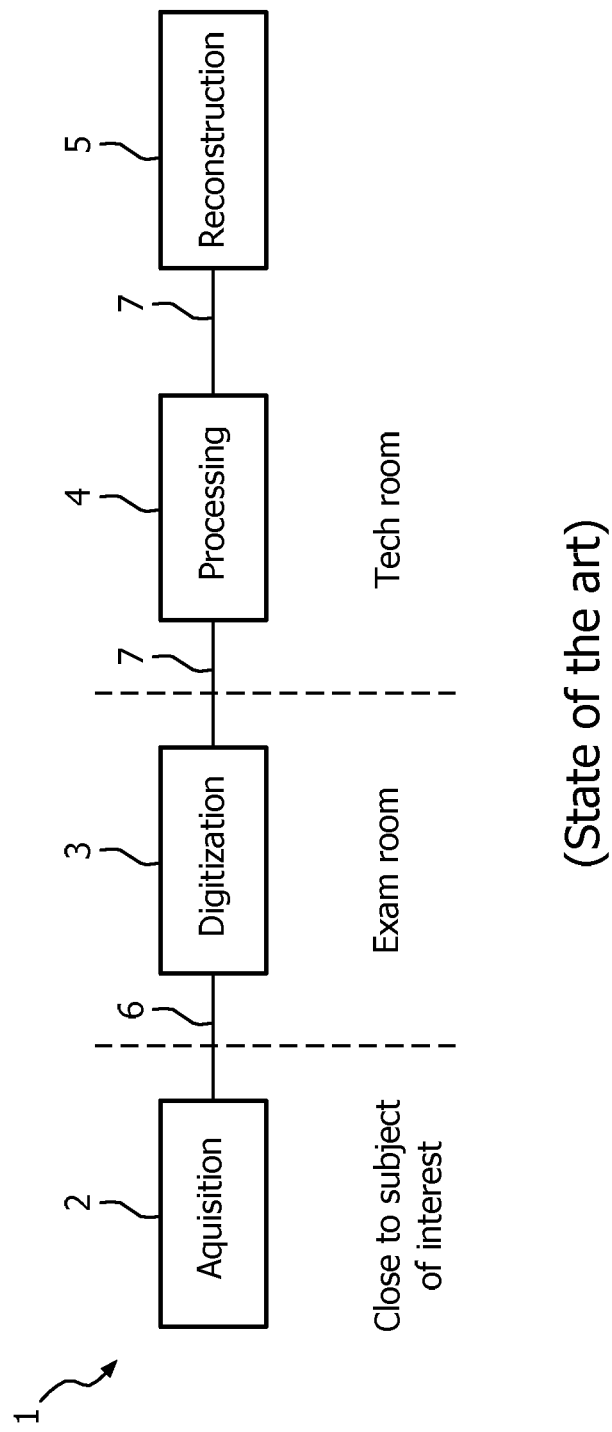
FIG. 1 is a schematic illustration of a partitioning of functional blocks for signal processing currently used in MR imaging systems known in the art.
Figure 2:
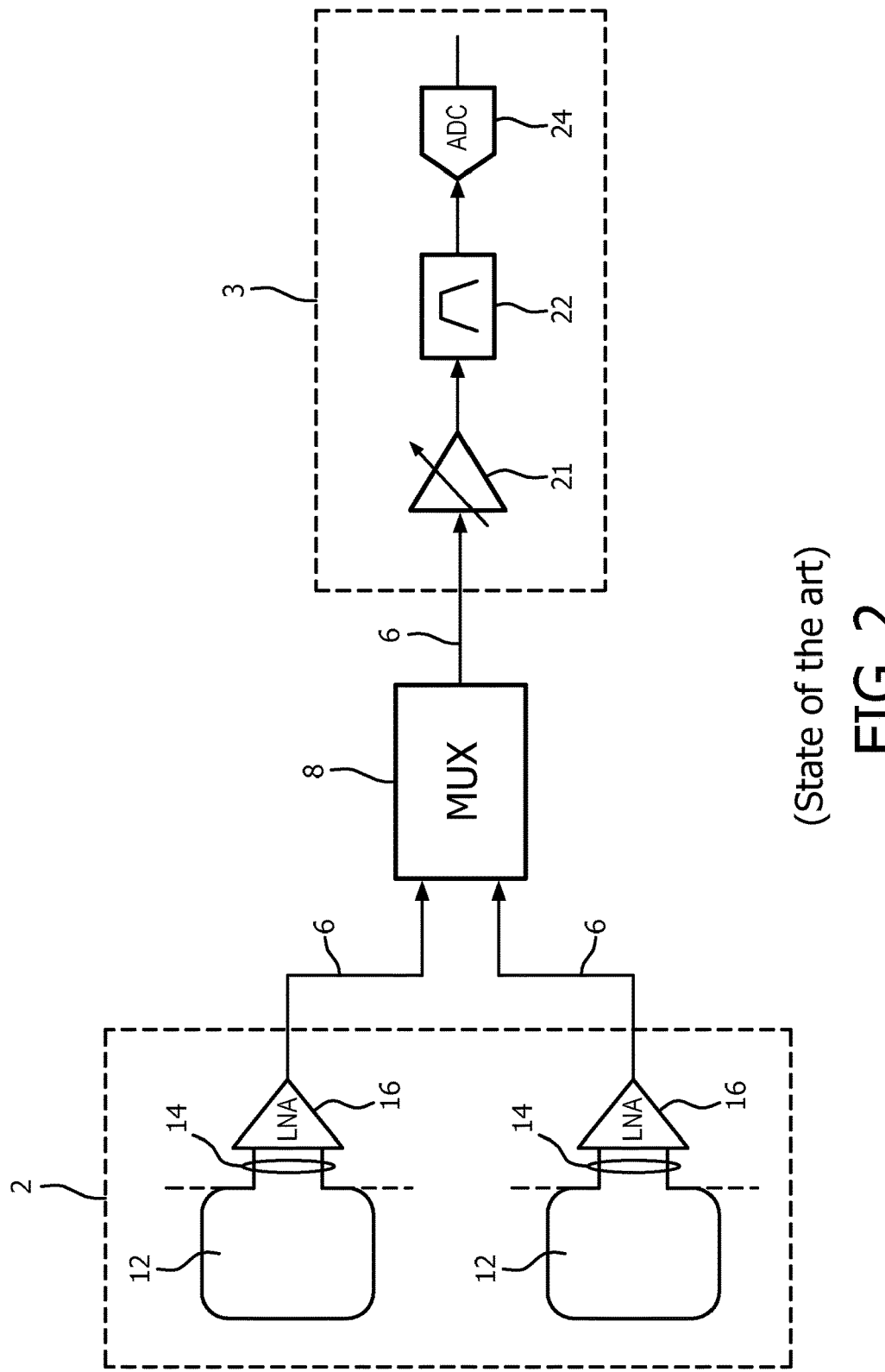
FIG. 2 is a schematic illustration of an acquisition block, a digitization block and an intermediate block in accordance with FIG. 1.
Figure 3:
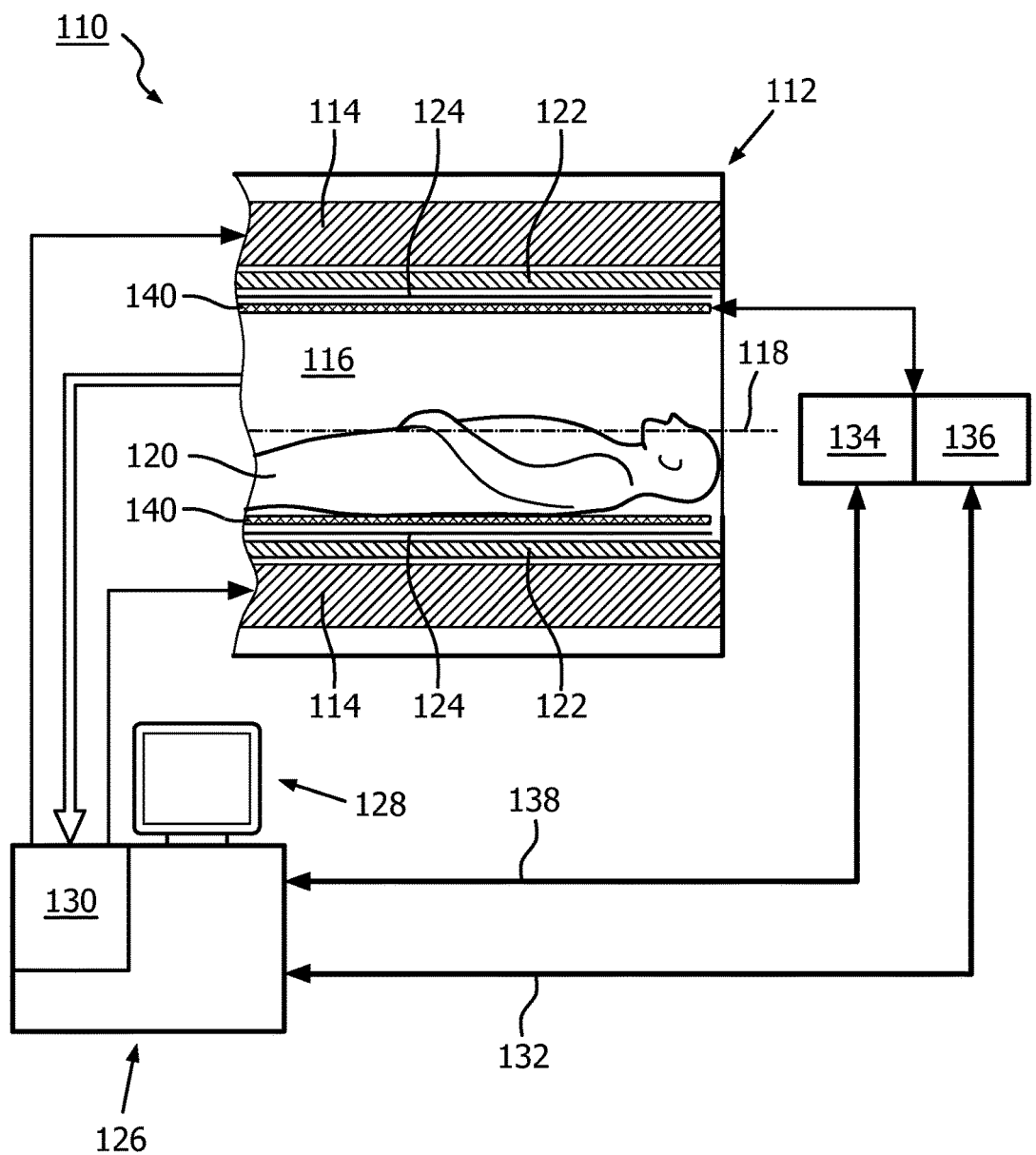
FIG. 3 is a schematic illustration of a part of an embodiment of a magnetic resonance (MR) imaging system in accordance with the invention.

FIG. 3 shows a schematic illustration of a part of an embodiment of a magnetic resonance (MR) imaging system 110 comprising an MR scanner 112. The MR imaging system 110 includes a main magnet 114 provided for generating a static magnetic field. The main magnet 114 has a central bore that provides an examination space 116 around a center axis 118 for a subject of interest 120, usually a patient, to be positioned within. In this embodiment, the central bore and therefore the static magnetic field of the main magnet 114 has a horizontal orientation in accordance with the center axis 118. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114.

Further, the MR imaging system 110 includes a radio frequency (RF) antenna device 140 designed as a wholebody coil having a tubular body. The RF antenna device 140 is provided for applying an RF magnetic field to the examination space 116 during RF transmit phases to excite nuclei of the subject of interest 120 and to receive MR information from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. A cylindrical metal RF screen 124 is arranged concentrically between the magnetic gradient coil system 122 and the RF antenna device 140.

Moreover, the MR imaging system 110 comprises an MR image reconstruction unit 130 provided for reconstructing MR images from acquired MR information signals and an MR imaging system control unit 126 with a monitor unit 128 provided to control functions of the MR scanner 112. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130, as described in more detail below.

Figure 4:
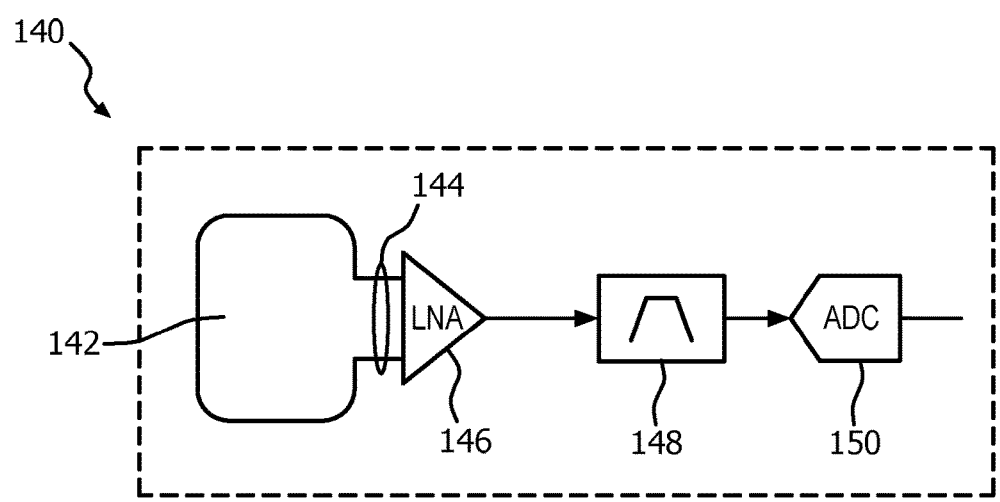
FIG. 4 is a schematic illustration of a RF antenna device in accordance with the invention.

The RF antenna device 140 is shown in detail in FIG. 4. The RF antenna device 140 in this embodiment comprises a single RF coil 142 with a single connection port 144, at which an analog MR information signal from the RF coil 142 is provided. The RF antenna device 140 further comprises a low noise amplifier 146 for amplifying the analog MR information signal. The amplified MR information signal is propagated to a band-pass filter 148 and an analog to digital converter (ADC) 150, which is provided as a single ASIC implementation. The ADC 150 in this embodiment is a RF band-pass sub-sampled sigma-delta analog to digital converter.

Figure 5:
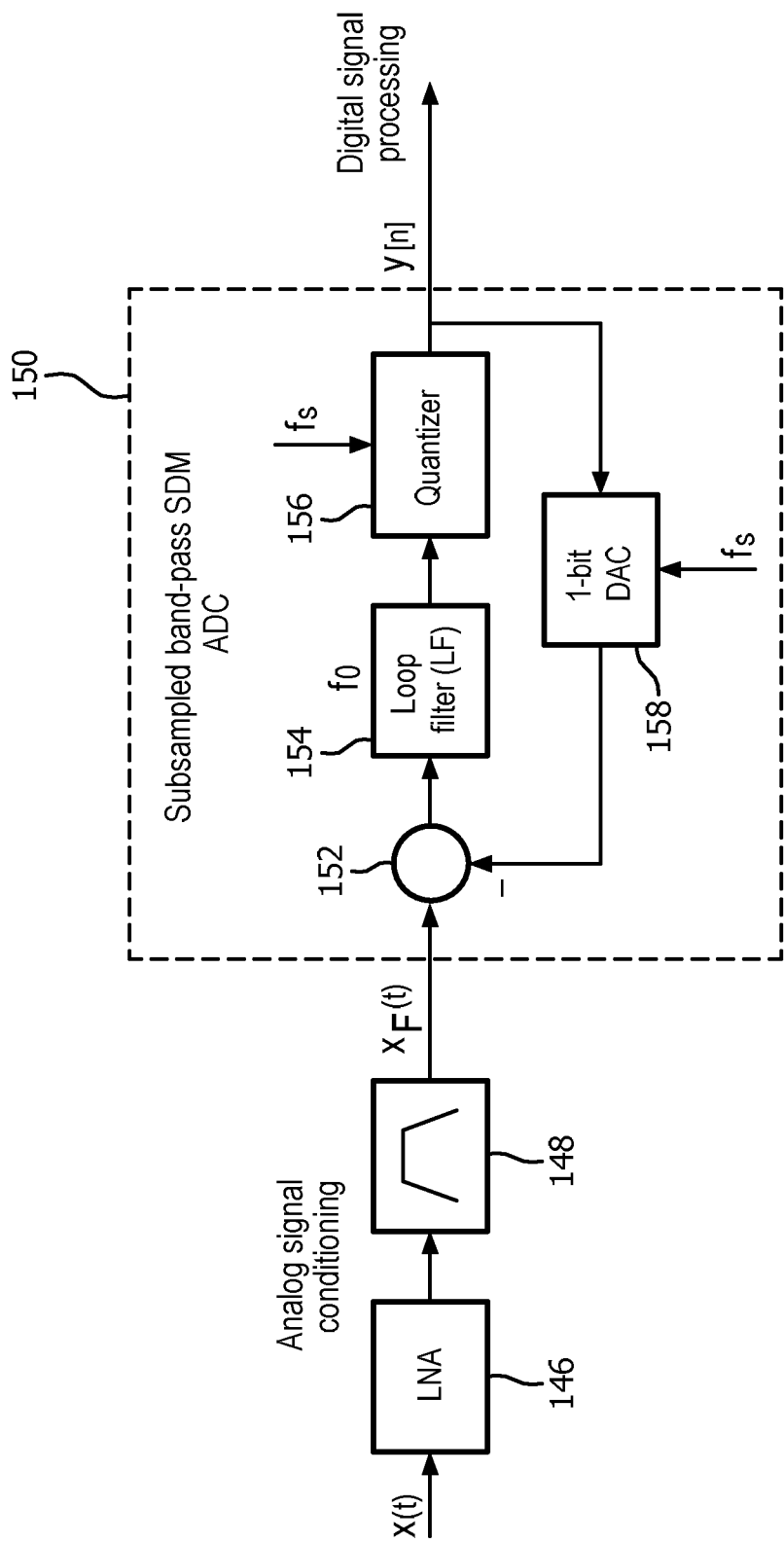
FIG. 5 is a detailed schematic illustration of electronic components of the RF antenna device of FIG. 4 including a subsampled band-pass SDM ADC in accordance with the invention.

The sigma-delta analog to digital converter 150 comprises a summator 152, a loop band-pass filter 154, a quantizer unit 156, and a digital to analog converter unit 158, which are arranged in a feedback configuration, as can be seen in FIG. 5. The quantizer unit 156 and the digital to analog converter unit 158 are provided as 1 bit converter units in this embodiment.

The quantizer unit 156 receives an analog filter signal of an analog input signal, which is filtered by the loop band-pass filter 154. The quantizer unit 156 converts this filter signal into a digital output signal, which is provided as the digital MR information signal by the RF antenna device 140. The digital to analog converter unit 158 receives the digital output signal of quantizer unit 156 and converts it into an analog feedback signal. The summator 152 is provided at an input path of the loop band-pass filter 154 and subtracts the analog feedback signal from the analog MR information signal to generate a difference signal that is used as input signal of the loop band-pass filter 154. The subtraction of the analog feedback signal at the summator 152 assures a negative feedback for the analog MR information signal.

The RF band-pass sub-sampled sigma-delta analog to digital converter 150 uses one sampling frequency $f_s$, i.e. the quantizer unit 156 and the digital to analog converter unit 158 have both the same sampling frequency $f_s$. The loop band-pass filter 154 is a tunable filter, which is adjustable to a modulation frequency of the analog MR information signal. The loop band-pass filter 154 is preferably tuned by modification of its filter coefficients, which results in a modification of a center frequency of the loop band-pass filter 154. The analog to digital conversion of the RF band-pass sub-sampled sigma-delta analog to digital converter 150 will be described later with respect to FIG. 6.

Figure 7:
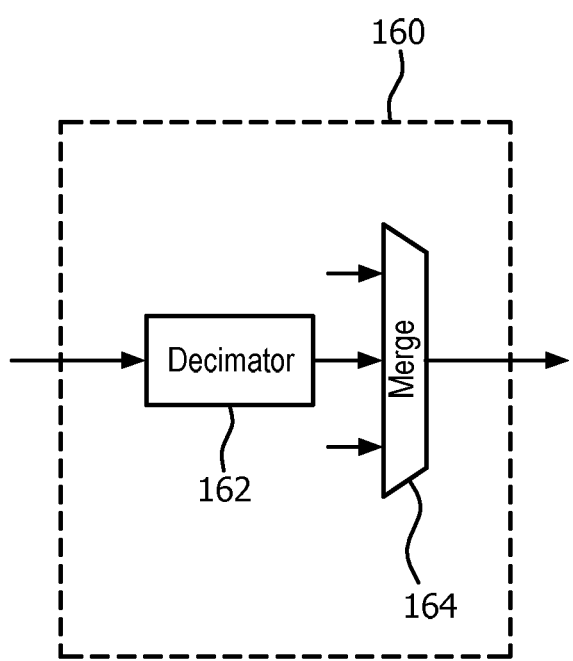
FIG. 7 is a schematic illustration of a digital signal processing unit of a MR imaging system in accordance with the invention, and FIG. 8 contains a table showing locations of signal processing components of different embodiments in comparison to a state of the Art implementation.

The MR imaging system 110 further comprises a digital signal processing unit 160, which can be seen in FIG. 7, for processing of the digital MR information signal provided by the RF antenna device 140. The RF antenna device 140 and the digital signal processing unit 160 are connected via a data cable, which is not explicitly shown in the figures. Accordingly, the digital signal processing unit 160 receives the digital MR information signal from the RF antenna device 140 for further processing. The digital signal processing unit 160 comprises a decimator 162 and a merger unit 164 for merging signals from different RF antenna devices 140. In this embodiment, the digital signal processing unit 160 is an integral component of the MR image reconstruction unit 130.

The positioning of the components of the MR imaging system 110 of this embodiment is indicated in table 8, center line. Accordingly, data acquisition, analog processing, digitization and data reduction are integrally implemented in the RF antenna device 140, i.e. the RF antenna device 140 comprises all components up to the band-pass sub-sampled sigma-delta analog to digital converter 150. Data transport and reconstruction using the digital signal processing unit 160 are performed in an exam room and/or a tech room.

In an alternative embodiment, which is shown in the bottom line of the table of FIG. 8, also data transport functionality is partially integrated into the RF antenna device 140. Furthermore, in the alternative embodiment, the decimator 162 of the signal processing unit 160 is integral part of the ASIC comprising the ADC 150.

In comparison, the upper line of the table of FIG. 8 refers to the positioning of components of an MR imaging system according to the state of the Art, where only data acquisition is performed in the RF antenna device. In the state of the Art, analog signal processing is performed away from the RF antenna device in the exam room. Digitization is performed in the tech room, as well as further data transport and image reconstruction.

In this embodiment, the control unit 126 of the MR imaging system 110 controls the RF band-pass sub-sampled sigma-delta analog to digital converter 150. The control unit 126 of the MR imaging system 110 sets operational parameters of the ADC 150 including sampling frequency, band-pass frequency and other filter parameters depending on a desired operation mode of the MR imaging system 110. This operation uses bi-directional communication.

Now will be described in detail the signal processing from the RF coil 142 to the digital signal processing unit 160 with reference to FIG. 6.

The RF coil 142 provides an analog MR information signal at its connection port 144. After amplification in the low noise amplifier 146 and filtering in the band-pass filter 148, the analog MR information signal is passed to the RF band-pass sub-sampled sigma-delta analog to digital converter 150. The spectral image of the input signal provided to the RF band-pass sub-sampled sigma-delta analog to digital converter 150 is shown in the upper diagram of FIG. 6. As can be seen in the diagram, this signal contains a modulation signal with a center frequency $f_0$, which is a narrow band signal around the center frequency $f_0$. Accordingly, the modulation signal has a small frequency range compared to its center frequency $f_0$.

Figure 6:
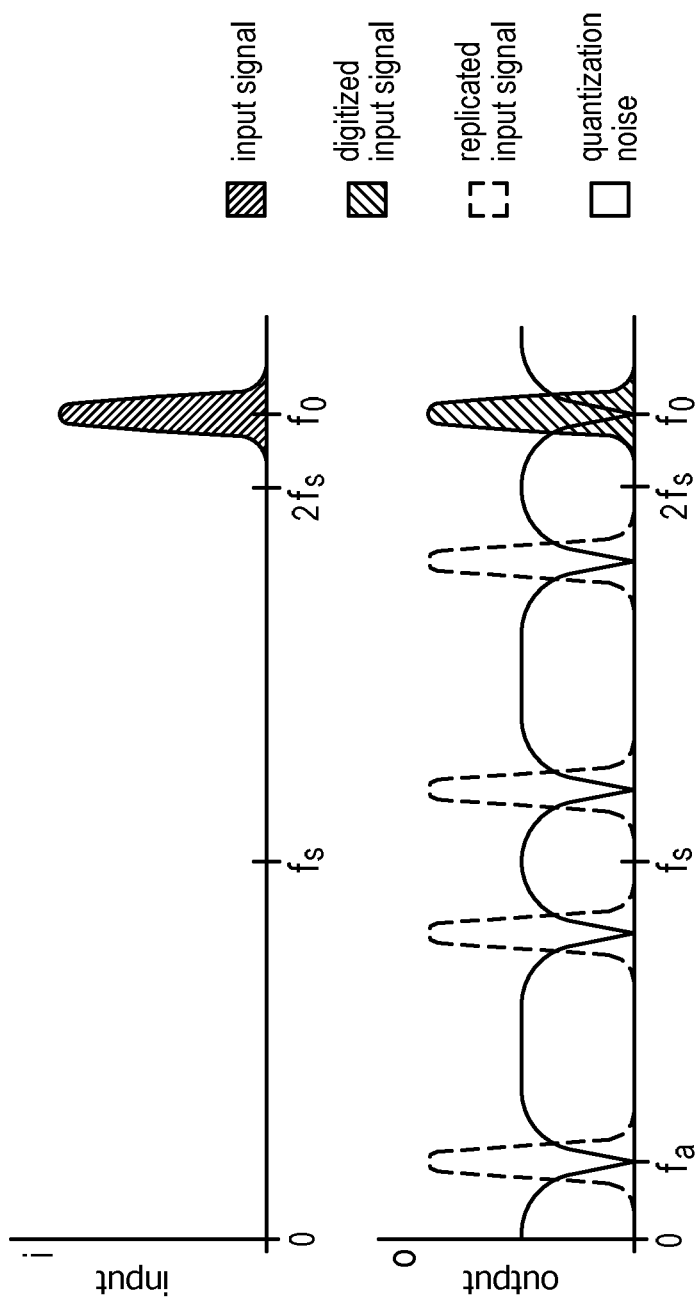
FIG. 6 is an illustration of a signal processing of the analog MR information signal to the digital MR information signal in accordance with the invention.

The band-pass sub-sampled sigma-delta analog to digital converter 150 operates at the afore-mentioned sampling frequency $f_s$, which is less than twice of the Nyquist frequency of a carrier signal of the analog MR information signal, to digitize the input signal shown in the upper diagram of FIG. 6. This is referred to as subsampling. In particular, the sampling frequency $f_s$ is below the Nyquist frequency of the modulation signal. Due to the subsampling, the digitized modulation signal is aliased to multiple aliasing frequencies, as can be seen the lower diagram in FIG. 6, including two aliasing frequencies below the sample frequency $f_s$. The aliasing frequencies can be calculated by $f_a = +/- f_0 - K_{SSF} * f_s$, where $K_{SSF}$ is an integer indicating a subsample factor, i.e. the relation between the sampling frequency $f_s$ and the center frequency $f_0$. Relevant is the aliasing frequency $f_a$ within the interval between $[0, f_s/2]$, which will further be referred to as $f_a$. The aliased modulation signal accordingly has a low center frequency, which is the aliasing frequency $f_a$. As can also be seen in FIG. 6, lower diagram, the sampling frequency $f_s$ is more than two times higher than the highest frequency of the aliased modulation signal, which has as center frequency the aliasing frequency $f_a$. When the signal shown in the lower diagram of FIG. 6 is digitized, the aliasing frequency $f_a$ is reliably digitized with high resolution at the sampling frequency $f_s$.

By choosing a subsampling factor $K_{SSF}$, the frequency location of the aliased modulation signal can be adapted to different modes of operation of the MR imaging system 110. These settings can be done by the MR imaging system control unit 126. The MR imaging system control unit 126 is in this embodiment also used to set the filter coefficients of the loop band-pass filter 154 to provide a stable filter.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST

1 MR imaging system
2 acquisition block, radio frequency (RF) antenna device
3 digitization block
4 processing block
5 reconstruction block
6 coaxial cable
7 digital cable
8 multiplexing block
12 RF coil
14 connection port
16 low noise amplifier
21 receive amplifier
22 band-pass filter
24 analog to digital converter (ADC)
110 magnetic resonance (MR) imaging system
112 magnetic resonance (MR) scanner
114 main magnet
116 RF examination space
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
142 RF coil
144 connection port
146 low noise amplifier
148 band-pass filter
150 analog to digital converter (ADC), sigma-delta analog to digital converter
152 summator
154 loop band-pass filter
156 quantizer unit
158 digital to analog converter unit
160 digital signal processing unit
162 decimator
164 merger unit

The invention claimed is:

1. A radio frequency (RF) antenna device for providing magnetic resonance (MR) information from an examination space of a MR imaging system, comprising:
at least one RF coil with at least one connection port for receiving an analog MR information signal,
and at least one analog-to-digital converter (ADC), which is connected to the at least one connection port and which converts the analog MR information signal into a digital MR information signal,
wherein the at least one ADC is a RF band-pass sub-sampled sigma-delta analog-to-digital converter, and
wherein the at least one ADC is provided with a sampling frequency ($f_s$) that is at least one of:
two times the Nyquist frequency of a carrier signal of the analog MR information signal, and
at least two times higher than the Nyquist frequency of a modulation signal in the analog MR information signal.

2. The RF antenna device according to claim 1, wherein the at least one ADC is provided as a single integrated circuit.

3. The RF antenna device according to claim 1, wherein the RF antenna device comprises at least one analog input filter, which is provided between the at least one ADC and the at least one connection port.

4. The RF antenna device according to claim 1, wherein the RF antenna device comprises at least one low noise amplifier, which is provided between the at least one ADC and the at least one connection port.

5. A radio frequency (RF) antenna device for providing magnetic resonance (MR) information from an examination space of a MR imaging system, comprising:
at least one RF coil with at least one connection port for receiving an analog MR information signal,
an RF band-pass sub-sampled sigma-delta analog-to-digital converter (ADC) connected with the at least one connection port and configured to convert the analog MR information signal into a digital MR information signal, the RF band-pass sub-sampled sigma-delta analog-to-digital converter including:
a summing circuit configured to combine the analog MR signal from the at least one RF coil and an analog feedback signal,
a loop band-pass filter connected to an output of the summing circuit and configured to filter the output,
a quantizer connected to the loop band-pass filter and configured to convert a filtered output of the loop band-pass filter into a digital output signal,
a digital-to-analog converter configured to convert the digital output signal from the quantizer into the analog feedback signal, and
wherein the summing circuit is configured to subtractively combine the analog feedback signal with the analog MR information signal, the combined feedback and MR information signal being supplied to the loop band-pass filter to be filtered and digitized by the quantizer, and
wherein the digital-to-analog converter is an N bit converter where N is 1.

6. The RF antenna device according to claim 5, wherein the loop band-pass filter is a tunable filter which is adjustable to a modulation frequency of the analog MR information signal.

7. The RF antenna device according to claim 5, wherein the quantizer and the digital-to-analog converter are both clocked with a sampling frequency which is less than 2 times the Nyquist frequency of a carrier signal of the analog MR information signal.

8. The RF antenna device according to claim 7, further including:
at least one low noise amplifier connected with the at least one connection port; and
at least one band-pass analog filter disposed between the at least one low noise amplifier and the summing circuit.

9. A magnetic resonance (MR) imaging system, comprising:
- a main magnet configured to generate a static magnetic field,
- a magnetic gradient coil system configured to generate gradient magnetic fields superimposed to the static magnetic field,
- an examination space configured to receive a subject of interest within,
- at least one radio frequency (RF) antenna device configured to provide magnetic resonance information from the examination space, the at least one radio frequency (RF) antenna device including:
  - at least one RF coil with at least one connection port configured to receive an analog MR information signal,
  - at least one analog-to-digital converter (ADC), which is connected to the at least one connection port and is configured to convert the analog MR information signal into a digital MR information signal,
  - wherein the at least one ADC is a RF band-pass sub-sampled sigma-delta analog-to-digital converter having a sampling frequency ($f_s$) below twice the Nyquist frequency of a highest frequency component of the analog MR information signal, and
- a digital signal processor configured to process the digital MR information signal.

10. The MR imaging system according to claim 9, comprising:
- a control unit for controlling the at least one analog-to-digital converter (ADC) of the RF antenna device.

11. A method for providing magnetic resonance information from an examination space of a magnetic resonance (MR) imaging system, the method comprising:
- receiving an analog MR information signal at at least one connection port of at least one RF coil within an RF antenna device,
- performing an analog-to-digital conversion of the analog MR information signal at a sampling frequency that is less than two times a Nyquist frequency of a carrier frequency of the analog MR information signal into a digital MR information signal in the RF antenna device, whereby the step of performing an analog-to-digital conversion comprises performing a band-pass sub-sampled sigma-delta analog-to-digital conversion, and
- transmitting the digital MR information signal from the RF antenna device via a communication link.

12. The method according to claim 11, further comprising the additional steps of:
- receiving the digital MR information signal from the RF antenna device at a reconstruction processor, which is provided apart from the RF antenna device, and
- processing the digital MR information signal into an image.

13. The method according to claim 11, wherein performing the analog-to-digital conversion of the analog MR information signal includes:
- amplifying the analog MR information signal with a low noise amplifier;
- filtering the amplified analog MR information signal with a band-pass filter;
- subtractively combining a feedback signal with the filtered analog MR information signal;
- filtering the combined analog MR information and feedback signal with the loop band-pass filter centered on a center frequency of the analog MR signal;
- digitizing the loop band-pass filtered combined MR information and feedback signal to generate the digital MR information signal; and,
- processing the digital MR information signal with a digital-to-analog converter to generate the analog feedback signal.

14. The method according to claim 13, further including:
- with one or more processors of the magnetic resonance imaging system, adjustably controlling the sampling frequency with which the combined analog feedback and MR signals are digitized and the sampling frequency of the digital-to-analog converter; and
- adjusting the center frequency of the loop band-pass filter.

15. A non-transitory computer-readable medium carrying software code which, when implemented on one or more processors of a magnetic resonance (MR) imaging system, controls the MR imaging system to:
- receive an analog MR information signal at at least one connection port of at least one RF coil of an RF antenna device,
- perform an analog-to-digital conversion of the analog MR information signal at a sampling frequency that is less than two times a Nyquist frequency of a carrier frequency of the analog MR information signal into a digital MR information signal in the RF antenna device, whereby the step of performing an analog-to-digital conversion comprises performing a band-pass sub-sampled sigma-delta analog-to-digital conversion, and
- transmit the digital MR information signal from the RF antenna device via a communication link.

16. A magnetic resonance (MR) imaging system comprising:
- a main magnet configured to generate a static magnetic field in an examination space configured to receive a subject to be moved;
- a magnetic gradient coil system configured to generate gradient magnetic fields superimposed on the static magnetic field in the examination space;
- a radio frequency (RF) antenna device disposed adjacent the subject in the examination space and configured to provide magnetic resonance (MR) information from the examination space, the RF antenna device including at least one RF coil configured to receive the MR information from the subject and output an analog MR information signal on a connection port, and an RF band-pass sub-sampled sigma-delta analog-to-digital converter (ADC) connected directly with the at least one connection port adjacent the examination space and configured to convert the analog MR information signal into a digital MR information signal, the RF band-pass sub-sampled sigma-delta analog-to-digital converter including:
  - a summing circuit configured to combine the analog MR signal from the at least one RF coil and an analog feedback signal,
  - a loop band-pass filter connected to an output of the summing circuit and configured to filter the output,
  - a quantizer connected to the loop band-pass filter and configured to convert a filtered output of the loop band-pass filter into a digital output signal,
  - a digital-to-analog converter configured to convert the digital output signal from the quantizer into the analog feedback signal, wherein the quantizer and the digital-to-analog converter are both clocked with a sampling frequency which is less than 2 times the Nyquist frequency of a carrier signal of the analog MR information signal, and wherein the summing circuit is configured to subtractively combine the analog feedback signal with the analog MR information signal, the combined feedback and MR information signal being supplied to the loop band-pass filter to be filtered and digitized by the quantizer to form the digital MR information signal;

one or more processors disposed remote from the examination space and configured to reconstruct the digital MR information signal into magnetic resonance images of the subject in the examination space; and a digital cable connected to the quantizer adjacent the examination space and the one or more processors to convey the digital MR information signal to the one or more processors for reconstruction.

17. The MR imaging system according to claim 16, wherein the loop band-pass filter is a tunable filter and wherein the one or more processors are further configured to:

adjust the loop band-pass filter to a modulation frequency of the analog MR information signal; and clock the digital-to-analog converter and the quantizer at the sampling frequency.

* * * * *